US012626557B2

(12) United States Patent
Huber et al.

(10) Patent No.: US 12,626,557 B2
(45) Date of Patent: May 12, 2026

(54) SENSOR ELEMENT AND DEVICE FOR CHECKING THE AUTHENTICITY OF A DATA CARRIER HAVING A SPIN RESONANCE FEATURE

(71) Applicant: GIESECKE+DEVRIENT CURRENCY TECHNOLOGY GMBH, Munich (DE)

(72) Inventors: Stephan Huber, Munich (DE); Thomas Happ, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 189 days.

(21) Appl. No.: 18/552,541

(22) PCT Filed: Mar. 22, 2022

(86) PCT No.: PCT/EP2022/025116
§ 371 (c)(1),
(2) Date: Sep. 26, 2023

(87) PCT Pub. No.: WO2022/199892
PCT Pub. Date: Sep. 29, 2022

(65) Prior Publication Data
US 2024/0177555 A1    May 30, 2024

(30) Foreign Application Priority Data

Mar. 26, 2021    (DE) ..................... 10 2021 001 594.0

(51) Int. Cl.
*G07D 7/04*        (2016.01)
*G01R 33/36*       (2006.01)
(52) U.S. Cl.
CPC .............. *G07D 7/04* (2013.01); *G01R 33/36* (2013.01)

(58) Field of Classification Search
CPC ........ G07D 7/04; G01R 33/36; G01R 33/341; G01R 33/60; G01R 33/307; G01N 24/10
See application file for complete search history.

(56) References Cited

U.S. PATENT DOCUMENTS 5,149,946 A * 9/1992 Jerome .................. G06K 7/086
                                                    324/318
2005/0270023 A1 12/2005 Freedman

FOREIGN PATENT DOCUMENTS

DE        3408086 A1    9/1985

OTHER PUBLICATIONS

Ellersiek, Dennis, "Entwicklung und Charakterisierung von mikrostrukturierten, Planarspulen fur Kernspinresonanz-Anwendungen" (English: "Development and characterization of microstructured planar coils for nuclear magnetic resonance applications"), RWTH Aachen University, Dissertation, Jan. 1, 2010, 350 pages.

(Continued)

*Primary Examiner* — G.M A Hyder
(74) *Attorney, Agent, or Firm* — Workman Nydegger

(57)        ABSTRACT

A sensor element for checking the authenticity of a planar data carrier, in particular a banknote, has a spin resonance feature. The sensor element contains a magnetic core having an air gap, into which the planar data carrier can be inserted for authentication and which defines an axial direction extending between the adjoining surfaces of the magnetic core, a polarization device for generating a static magnetic flux in the air gap, a modulation device for generating a time-varying magnetic modulation field in the air gap, and a resonator for exciting the spin resonance feature of the data carrier to be checked. The modulation device is formed by at least one planar coil arranged in the air gap, which planar coil has one or more turns about the axial direction of the air (Continued)

Figure 5:
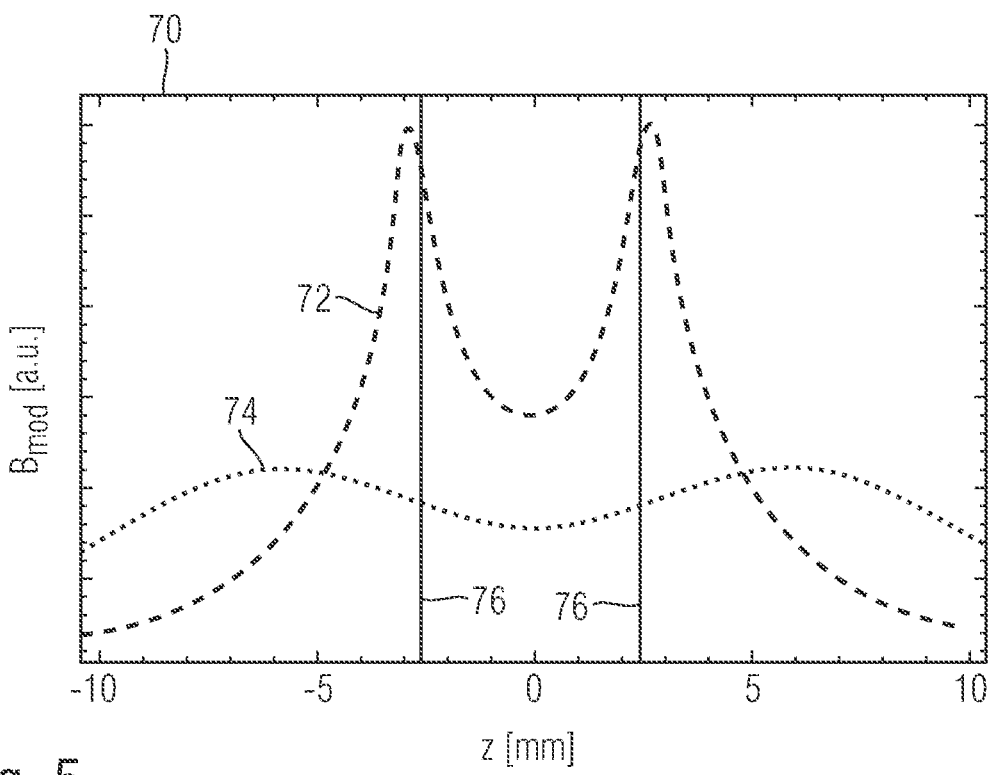

gap in one plane. The disclosure also relates to a checking device having such a sensor element.

14 Claims, 3 Drawing Sheets

(56)                  References Cited

OTHER PUBLICATIONS

Ahmad et al., "Theory, Instrumentation, and Applications of Electron Paramagnetic Resonance Oximetry", Chemical Reviews, May 12, 2010, vol. 110, No. 5, pp. 3212-3236.

International Search Report from corresponding PCT Application No. PCT/EP2022/025116, Jul. 14, 2022.

German Search Report from corresponding DE Application No. 102021001594.0, Feb. 12, 2024.

* cited by examiner

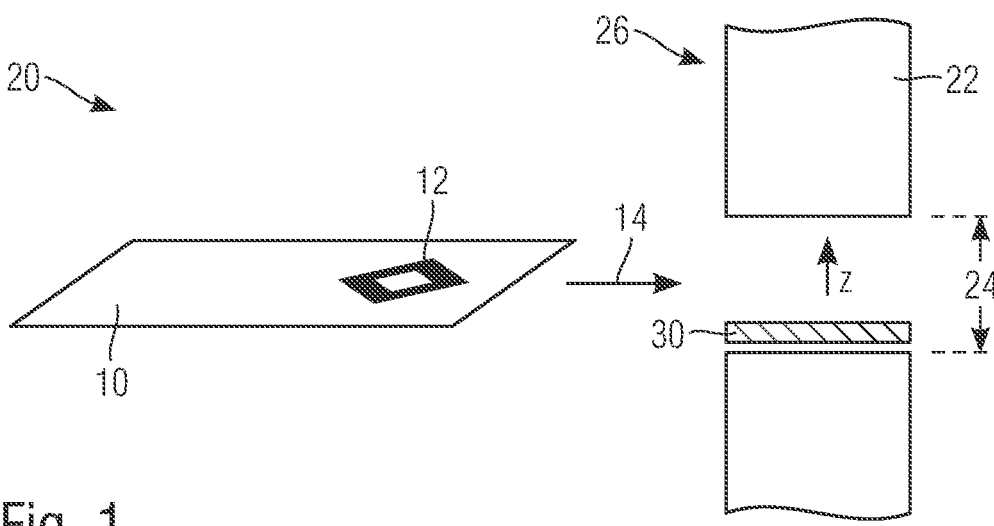
Fig. 1
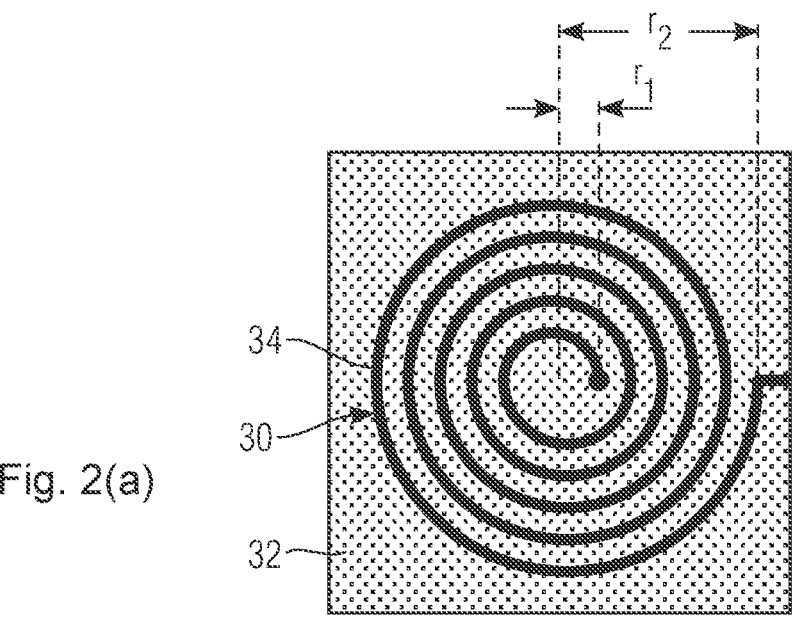
Fig. 2(a)
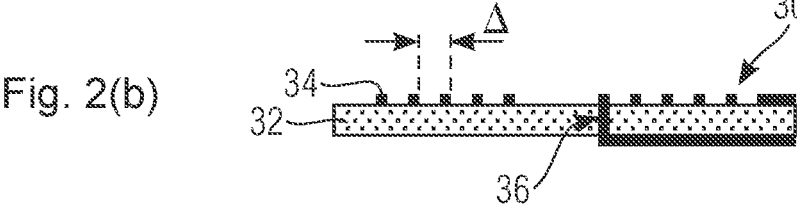
Fig. 2(b)
Fig. 2

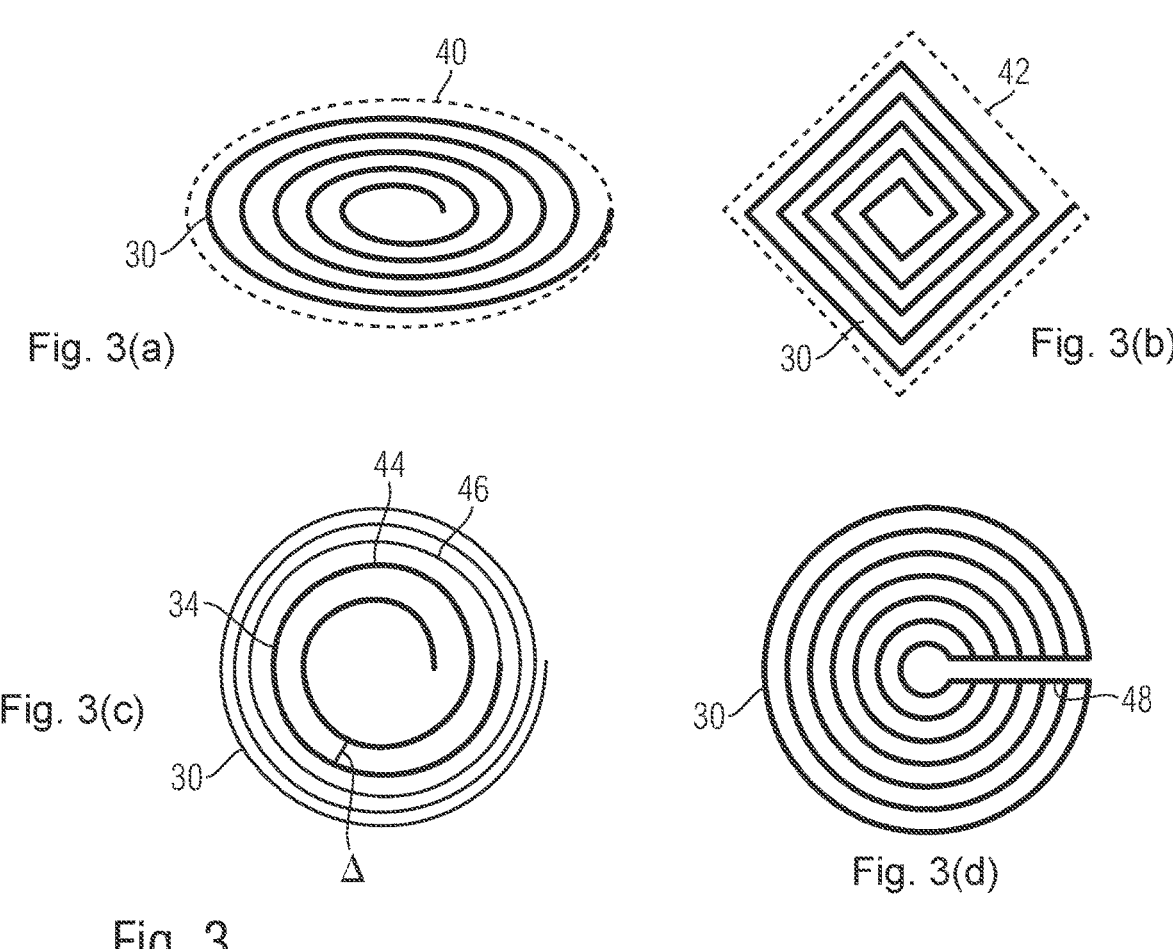
Fig. 3(a)
Fig. 3(b)
Fig. 3(c)
Fig. 3(d)
Fig. 3
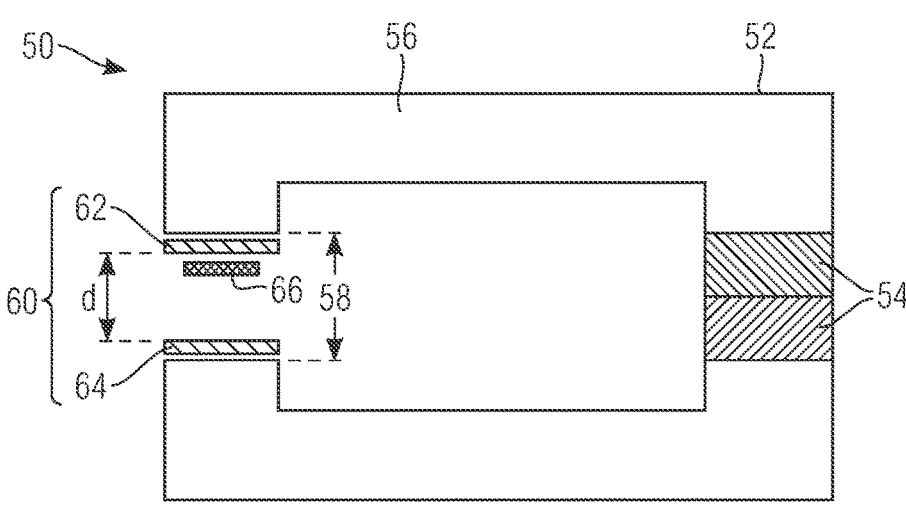
Fig. 4

SENSOR ELEMENT AND DEVICE FOR CHECKING THE AUTHENTICITY OF A DATA CARRIER HAVING A SPIN RESONANCE FEATURE

BACKGROUND

The invention relates to a sensor element for checking the authenticity of a planar data carrier, in particular a banknote, having a spin resonance feature, and to a checking device having such a sensor element.

Data carriers, such as value or identification documents, but also other valuable objects, such as brand-name articles, are often provided with security elements that allow the data carriers to be authenticated and that also serve as protection against unauthorized reproduction. It is well known in the field of machine authentication to use security elements with spin resonance features to secure documents and other data carriers. The security elements are provided with substances that have a spin resonance signature. The spin resonance signatures that can be used for authenticity checking include, in particular, nuclear magnetic resonance (NMR) effects, electron spin resonance (ESR) effects, and ferromagnetic resonance (FMR) effects.

In the process of checking banknotes, three different magnetic fields are usually generated in the measuring range of a banknote processing machine, for example, to detect the spin resonance signatures. This is specifically a quasi-static polarization field $B_0$, which runs parallel to the axial direction (z-direction) of the air gap of a magnetic circuit. A second magnetic field is formed by a modulation field $B_{mod}$, which also runs parallel to the z-axis and typically has a frequency f mod in the kHz range. For excitation of transitions between the split spin energy levels of the spin resonance signature substances, an excitation field $B_1$ is provided, which typically has frequencies above 1 GHZ and is polarized perpendicular to the $B_0$ direction.

To generate the polarization field $B_0$, a magnetic circuit is often used that directs the magnetic flux of a permanent magnet or a coil to the air gap in which the detection of the spin resonance signatures takes place. To generate the modulation field $B_{mod}$, a single cylindrical coil or a cylindrical coil pair in a Helmholtz configuration is usually used, i.e. a cylindrical coil pair in a configuration in which two cylindrical coils with coil radius r are placed parallel to each other on the same axis at a distance r and through which the same current is allowed to flow in the same direction. The cylindrical coils are often wound around the magnetic circuit near the air gap, but can also be arranged directly in the air gap. For generating the excitation field $B_1$, a resonator is typically used which is also usually arranged in the air gap.

For the authentication check, a test specimen is placed in the air gap of the magnetic circuit and checked for the presence of a spin resonance signature. The measured spin resonance signal strength increases with both the field strength of the polarization field $B_0$ and the field strength of the modulation field $B_{mod}$, so that both field strengths are advantageously maximized. The field strength of the polarization field $B_0$ is approximately indirectly proportional to the height of the air gap, which means it can be increased by reducing the overall height of the air gap. An increase in the field strength of the modulation field can be achieved, for example, by using modulation coils with as many turns as possible.

These requirements result in a conflict of objectives in practice: if a cylindrical coil or a cylindrical coil pair is arranged in the air gap for generating the modulation field $B_{mod}$, the overall size of the cylindrical coils increases as the number of turns increases. Accordingly, either the air gap height must be increased or the maximum number of turns of the coil must be limited, thus limiting either the field strength of the polarization field $B_0$ or the field strength of the modulation field $B_{mod}$, and thus in both cases limiting the strength of the spin resonance signal.

If, on the other hand, the cylindrical coils are not arranged in the air gap but are wound around the magnetic circuit, the modulation field $B_{mod}$ induces more eddy currents there, which in turn introduce a number of disadvantages.

On the one hand, the magnetic field generated by the eddy currents has a polarity opposite to its cause, according to Lenz's law. The eddy currents therefore weaken the modulation field and give rise to a signal reduction. Furthermore, the sensor operation requires short measuring times and therefore also high modulation frequencies, in particular for high-speed banknote processing machines. However, since the strength of eddy currents increases with the modulation frequency, sensor operation on high-speed machines becomes more difficult. Finally, the energy dissipation associated with the eddy currents in the magnetic core leads to a temperature increase and thus to a varying magnetic resistance, which in turn leads to a drift in the flux density in the air gap and thus ultimately to an unwanted drift in the useful signal.

SUMMARY

Based on this, the object of the invention is to provide an improved device for checking the authenticity of data carriers having spin resonance features, which enables in particular a high useful signal strength and also allows the checking of fast-moving data carriers.

The invention provides a sensor element for checking, in particular checking the authenticity, of a planar data carrier having a spin resonance feature. The planar data carrier can be formed by a banknote, for example. The sensor element contains a magnetic core with an air gap into which the planar data carrier can be inserted for authentication. The air gap defines an axial direction extending between the adjacent surfaces of the magnetic core.

The sensor element further comprises a polarization device for generating a static magnetic flux in the air gap, a modulation device for generating a temporally varying magnetic modulation field in the air gap, and a resonator for exciting the spin resonance feature of the data carrier to be checked.

The resonator is also designed in particular for detecting spin resonance signals of the spin resonance feature. The resonator can also record a response signal of the spin resonance feature and output it to a detector.

The spin resonances can be determined, for example, with a continuous wave (CW) method, a pulsed method, or a rapid scan method.

As a special feature of the sensor element, it is provided that the modulation device is formed by at least one planar coil arranged in the air gap, which planar coil has one or more turns about the axial direction of the air gap in one plane.

With the design of the modulation device according to the invention, the problems described above can be overcome. A planar coil with a sufficiently large number of turns can easily be arranged directly in the air gap of the magnetic core, since planar coils have a significantly smaller overall size, in particular in the axial direction, than comparable cylindrical coils. Due to the positioning of the at least one planar coil in the air gap, an induction of eddy currents in the magnetic core is suppressed or largely prevented. Finally, due to the geometry of a planar coil, the modulation field it generates is very readily accessible for banknote checking, while in the case of a single cylindrical coil, the region of the strongest field lies within the coil body enclosed by the turns, which is not accessible by a banknote test specimen in an automated measurement process.

The above-mentioned plane with the one or more turns is advantageously perpendicular to the axial direction of the air gap. Thus, the modulation field is advantageously aligned parallel to the polarization field.

In a preferred design, the at least one planar coil has a spiral conductor track layout with a minimum inner radius and a maximum outer radius. The outer contour of the conductor track layout of the at least one planar coil is advantageously circular, elliptical, rectangular or polygonal.

In an advantageous design the conductor track spacing between successive turns of the at least one planar coil is constant and thus enables a particularly simple design of the coil. In an alternative, likewise advantageous embodiment, the conductor track spacing between successive turns varies, and in particular it can increase strictly monotonically or decrease strictly monotonically. The variation of the conductor track spacing is advantageously selected such that the field distribution generated by the planar coil in the air gap, in particular at a measuring position in the air gap, is particularly homogeneous.

The number of turns of the at least one planar coil is advantageously between 2 and 100 (each inclusive), preferably between 10 and 30 (each inclusive). With a number of turns in this range, given typical conductor track dimensions both the strength and the distribution of the modulation field in the air gap can be optimized.

In an advantageous, simple design the modulation device contains only a single planar coil, but a plurality of planar coils may also be provided in the modulation device, for example, a plurality of planar coils may be stacked to increase the strength of the generated modulation field. If the modulation device contains more than one planar coil, then according to an advantageous design these planar coils are formed identically, thus having in particular the same geometry and number of turns.

In an advantageous extension of the invention, the modulation device contains two planar coils, which are axially spaced apart on the upper side or underside of the air gap. The two aforementioned planar coils are arranged and matched to each other in such a way that they generate a homogeneous field pattern of the modulation field between each other. It is preferably provided for this purpose that the two aforementioned planar coils are each formed with a conductor track layout having the same minimum inner radius and the same maximum outer radius and being a distance apart in the axial direction which preferably corresponds to +/−10% or substantially to double the inner radius of each coil. A current of equal strength preferably flows through them in the same direction.

The at least one planar coil is conveniently formed on a coil carrier, in particular a printed circuit board. The latter enables the coils to be manufactured in an easily reproducible and cost-effective manner. If the resonator is also formed on a printed circuit board, according to an advantageous embodiment, for example in the form of a stripline resonator, the resonator can be advantageously arranged together with the at least one planar coil on different PCB layers of the same component, so that a particularly simple and compact design is obtained.

In another, likewise advantageous embodiment, the at least one planar coil is formed on a ferromagnetic carrier, for example in the form of a conductor track on an electrical insulation layer, for example, an oxide layer or a polymer layer, on a soft-iron plate, or on a ferrite or powder core. The coil may also be formed by an enameled wire on iron or on a ferrite substrate or powder core. The planar coil is preferably electrically insulated from the ferromagnetic carrier. The use of a ferromagnetic carrier allows a further reduction of the air gap height due to the increased magnetic flux density.

In an advantageous design the at least one planar coil is connected to a capacitor, and together with this forms a resonant oscillator circuit. Related to this, the current flowing through the planar coil and thus also the strength of the modulation field increases, so that a larger spin resonance signal can be obtained during the authenticity check. As explained above, the modulation field can also be increased by using a plurality of stacked planar coils in the modulation device. In this case, it has proved particularly effective if the modulation device comprises at least one double planar coil, in which the turns of a planar coil are arranged coaxially on the upper side and underside of a coil carrier.

The element for generating a static magnetic flux is advantageously formed by a permanent magnet. This reduces energy consumption and waste heat compared to a structure in which the static component of the magnetic flux is also generated by an electromagnet. In other designs, however, it may also be advantageous to generate not only the time-varying component, but also the static component of the magnetic flux in the air gap by means of electromagnets. This allows for particularly simple handling after the sensor element has been switched off, in particular when assembling, disassembling, and transporting the checking device.

The resonator is advantageously arranged in the air gap of the magnetic core. A planar surface resonator, in particular a stripline resonator, is advantageously used.

The sensor element advantageously also has a ramp coil for generating a slowly time-varying magnetic field in relation to the modulation field in the air gap. The ramp coil is preferably wound around the magnetic core. The ramp coil is used in particular to generate a ramp function of the polarization field and/or to compensate for any drift in the strength of the polarization field.

The above-mentioned modulation coil is preferably designed to generate a magnetic field varying with a frequency between approximately 1 kHz and approximately 1 MHz in the air gap. The said ramp coil is preferably designed to generate a magnetic field varying with a frequency below approximately 1 kHz in the air gap. The resonator is preferably designed to excite and detect spin resonance signals with a frequency of between approximately 1 MHz and 100 GHz.

The spin resonance feature of the data carrier to be checked is advantageously a nuclear spin resonance feature, an electron spin resonance feature, or a ferromagnetic or ferrimagnetic resonance feature.

In the case of nuclear spin resonance features, the resonator is preferably resonant in a frequency range between 1 MHz and 70 MHz. A frequency range between 2 MHz and 50 MHz is particularly preferred.

In the case of electron spin resonance features or ferromagnetic or ferrimagnetic resonance features, the resonator is preferably resonant in a frequency range between 1 GHz and 100 GHz. A frequency range between 5 GHz to 85 GHz, in particular between 15 GHz to 50 GHz, is particularly preferred.

The invention further comprises a checking device for checking, in particular authenticity checking, of planar data carriers, in particular of banknotes, having a sensor element of the described type. The checking device further comprises a transport device which introduces the planar data carriers to be checked along a transport path into the air gap of the magnetic core or guides them through the air gap of the magnetic core. The testing device may, in particular, be part of a bank note processing machine.

Finally, the invention also contains a method for checking a planar data carrier having a spin resonance feature, wherein the checking is carried out by means of a sensor element of the type described above. The planar data carrier to be tested can be a banknote, for example. In the method, a planar data carrier to be checked is inserted into the air gap of the magnetic core of the above-mentioned sensor element and a static magnetic flux is generated in the air gap using the polarization device. The modulation device is used to generate a time-varying magnetic modulation field in the air gap, wherein a device is provided as the modulation device which is formed by at least one planar coil arranged in the air gap, which planar coil has one or more turns about the axial direction of the air gap in one plane. The resonator is also used to excite the spin resonance feature of the data carrier to be checked.

In an advantageous conduct of the method, a response signal of the spin resonance feature generated by the excitation is also recorded with the resonator and output to a detector. In principle, a response signal of the spin resonance feature can also be recorded with a separate detection device.

The excitation of the spin resonance feature and/or the recording of the response signal of the spin resonance feature is/are carried out in a continuous wave (CW) method, in a pulsed method, or in a rapid scan method.

In the checking of planar data carriers having a nuclear spin resonance feature, the excitation by the resonator is preferably generated in a frequency range between 1 MHz and 70 MHz, in particular between 2 MHz and 50 MHz. In the checking of planar data carriers having an electron spin resonance feature or a ferromagnetic or ferrimagnetic resonance feature, the excitation by the resonator is preferably generated in a frequency range between 1 GHz and 100 GHz, preferably between 5 GHz and 85 GHz, particularly preferably between 15 GHz and 50 GHz.

The result of the check is usually evaluated by comparing the recorded response signal with a response signal expected for the spin resonance feature. If the expected response signal is recorded within a certain tolerance range, the presence of the correct spin resonance feature and thus, for example, the authenticity of the data carrier can be concluded.

Further exemplary embodiments as well as advantages of the invention are explained below by reference to the figures, in the representation of which a true-to-scale and proportional reproduction has been omitted in order to increase the clarity.

Figure 6:
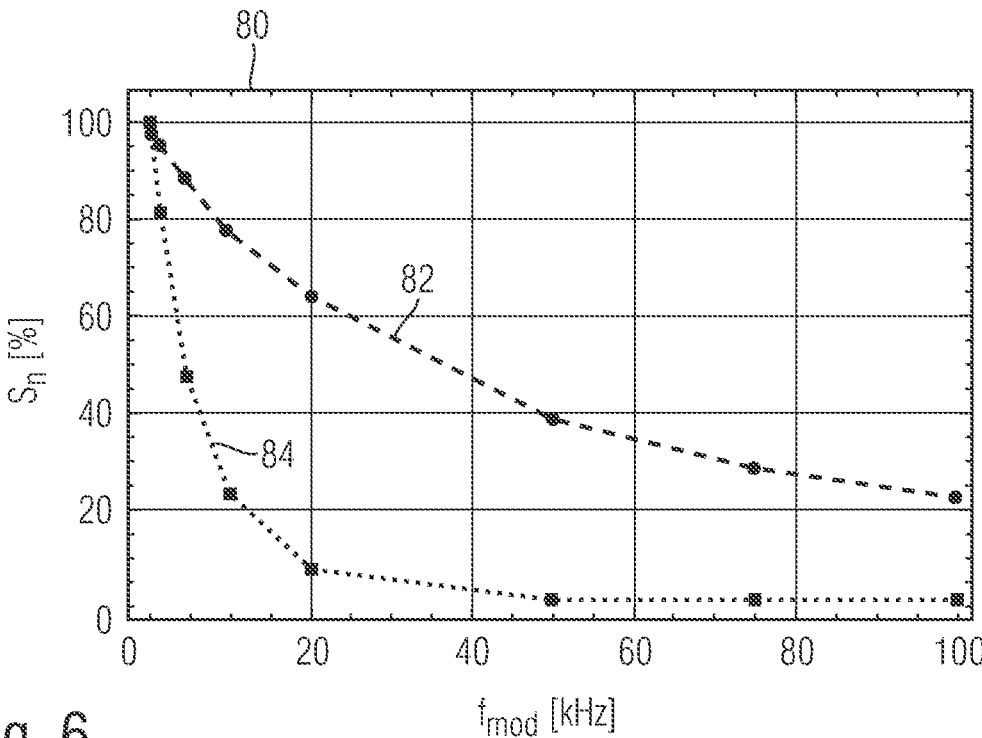

IN THE DRAWINGS:

FIG. 1 schematically shows a checking device with a supplied banknote test specimen, FIG. 2, including FIGS. 2(a) and 2(b), shows the planar coil used in the sensor element of FIG. 1, in (a) in plan view and in (b) in cross-section, FIG. 3, including FIGS. 3(a) to 3(d), shows in (a) to (d) some advantageous embodiments of planar coils according to the invention, FIG. 4 shows a sensor element according to another exemplary embodiment of the invention having a pair of planar coils in the air gap, FIG. 5 shows the analytically calculated field pattern of a pair of planar coils in comparison with a pair of cylinder coils in a Helmholtz configuration, and FIG. 6 shows experimental results of a comparison of planar coils with cylindrical coils that are wound around the magnetic core of the magnetic circuit outside the air gap.

The invention will now be explained using the example of the authenticity checking of a banknote 10. FIG. 1 schematically shows a checking device 20 of a banknote processing system, of which only the portion of the sensor element 26 which is particularly relevant to the present invention is shown in the figure.

The banknote test specimen 10 contains, in a feature region, a spin resonance feature 12 to be checked, the characteristic properties of which are used to prove the authenticity of the banknote. The test specimen is guided along a transport path 14 through the checking device 20, specifically through the air gap 24 of a magnetic circuit with a magnetic core 22.

The air gap 24 extends in an axial direction between the surfaces of the magnetic core 22 adjacent to the air gap. The axial direction of the air gap is also referred to as the z-axis, and the directions perpendicular to it define an x-y plane. In the x-y plane, the magnetic core 22 may be, for example, circular, elliptical, square, rectangular, or polygonal. As explained above, three different magnetic fields are generated in the air gap 24 to detect signatures of the spin resonance feature 12, namely a quasi-static polarization field $B_0$ parallel to the z axis, a modulation field $B_{mod}$, also parallel to the z axis, and a field $B_1$ perpendicular to them, which induces the energy transitions between the spin energy levels in the spin resonance feature 12.

To generate the polarization field $B_0$ in the exemplary embodiment, a magnetic circuit with the magnetic core 22 is used, which directs the magnetic flux of a permanent magnet and/or a coil to the air gap 24. As a special feature, a planar coil 30 arranged in the air gap 24 is used to generate the modulation field $B_{mod}$, which coil comprises a plurality of turns around the z axis in the x-y plane.

The excitation field $B_1$ is generated by means of a resonator, which is omitted in FIG. 1 for the sake of clarity.

The planar coil 30 is shown in more detail in FIG. 2(a) in plan view and in FIG. 2(b) in cross-section. In contrast to a cylindrical coil with the same number of turns, the planar coil 30 with a sufficiently large number of turns can be easily placed in a narrow air gap 24. Due to the arrangement of the planar coil 30 in the air gap 24, the induction of eddy currents in the magnetic core 22, with the disadvantages described above, is suppressed. In addition, due to its geometry the modulation field generated by the planar coil 30 is very easily accessible for the banknote test specimen 10.

The planar coil 30 is mounted on a printed circuit board 32 and has a spiral pattern of the conductor paths 34 between a minimum inner radius $r_1$ and a maximum outer radius $r_2$. In the exemplary embodiment, the planar coil 30 has five turns with a constant conductor track spacing Δ. In the central region of the planar coil 30, a via 36 is provided for returning the conductor.

As already explained in principle above, the formation of the planar coil 30 on a printed circuit board offers several advantages. In addition to a reproducible and cost-effective manufacture, the resonator for the excitation field $B_1$ can also be formed on a printed circuit board so that the planar coil 30 (or plurality of planar coils) and the resonator can be implemented compactly in different circuit board layers of the same component.

However, the planar coil 30 can also be mounted on other, for example ferromagnetic, carriers, and a planar coil with exposed windings can also be considered.

In the geometry of the planar coils, other geometries can be used advantageously in addition to the spiral conductor track layout shown in FIG. 2 with a circular outer contour. FIGS. 3 (*a*) to (*d*) show some further advantageous embodiments, wherein for the sake of clarity only the planar coil itself without coil carrier is shown in each case.

Specifically, the planar coil 30 of FIG. 3(*a*) has a spiral-shaped conductor track layout with elliptical outer contour 40, and the planar coil 30 of FIG. 3(*b*) has a spiral-shaped conductor track layout with rectangular outer contour 42. Other polygonal outer contours, such as triangular, pentagonal, hexagonal, or octagonal, can also be considered.

Such a variation of the outer contours is advantageous in order to be able to match the spatial $B_{mod}$-distribution to the distribution of the polarization field $B_0$. A similar $B_0$- and $B_{mod}$-distribution in the air gap can be thereby achieved, and thus the formation of signal artifacts can be suppressed.

The exemplary embodiment of FIG. 3(*c*) illustrates that the distance Δ between successive turns and the width of the conductor tracks do not need to be constant. In the planar coil 30 of FIG. 3(*c*), for example, the spacing Δ decreases strictly monotonically from the inside to the outside and the conductor tracks 34 in the inner part 44 of the coil are formed with a larger width than in the outer part 46 of the coil. Variations in the conductor track spacing Δ and the conductor track width allow the field distribution of the planar coil 30 in the air gap 24 to be made particularly homogeneous. Thus, the $B_{mod}$ field generated by a planar coil has its maximum on the coil axis. As the radial distance from the coil axis increases, the field decreases. By increasing the number of turns in the outer region of the coil, this field decrease can be compensated and the field distribution in the radial direction can be homogenized. By simultaneously reducing the conductor track width in the outer region of the coil, the turn density can be increased further. It goes without saying that the variations described in connection with FIG. 3(*c*) can be combined with all the geometries of the planar coils.

Given a suitable design of the conductor tracks 34, it is also possible to dispense with a via for routing the conductor track. The exemplary embodiment of FIG. 3(*d*) illustrates a planar coil 30 in which the turns are formed in a circular manner with a constant radius in each case and in which the conductor track layout 48 is arranged in the same plane as the turns of the planar coil, so that no via is required. This allows the coil to be advantageously realized on a single PCB layer. Of course, this design can also have a different geometry of the outer contour instead of the circular geometry and variations of the conductor track spacing and track width can be used.

A planar coil 30 arranged in the air gap 24 of the magnetic core has particularly advantageously between 10 and 30 turns, since it has been shown that with a number of turns in this range, for typical conductor track dimensions, both the strength and the distribution of the modulation field in the air gap 24 can be optimized. As can be seen from FIG. 1, due to the planar design of the coil 30, only a minimum of installation space is taken up in the air gap, which means that the air gap does not need to be increased unnecessarily for a high modulation field $B_{mod}$, thus reducing the field strength of the polarization field $B_0$.

FIG. 4 shows another exemplary embodiment of a sensor element 50 according to the invention, in which a pair of planar coils is provided in the air gap. Specifically, the sensor element 50 contains a polarization magnet 52 with a keeper with a permanent magnet 54 and a magnetic core 56 with an air gap 58, through which the transport path of the banknote test specimens passes.

In the air gap 58, in addition to a resonator 66 for generating the excitation field $B_1$, a modulation device 60 for generating the magnetic modulation field $B_{mod}$ is arranged, which in the exemplary embodiment consists of a pair of planar coils 62, 64, axially spaced apart on the upper and underside of the air gap 58. In this case, the minimum inner radius $r_1$ and the maximum outer radius $r_2$ of the conductor track layout of the planar coils 62, 64 are matched to the axial coil spacing in such a way that a field pattern that is as homogeneous as possible is formed in the air gap between the two planar coils 62, 64. For this purpose, the axial distance between the coils can be, for example, double the inner radius $r_1$ of the two coils.

FIGS. 5 and 6 use comparison calculations and respectively comparative tests to illustrate the superior properties of modulation devices according to the invention having planar coils compared to designs with conventional cylindrical coils.

Firstly, the diagram 70 of FIG. 5 shows the analytically calculated field pattern of a pair of planar coils (curve 72) in comparison to a corresponding pair of cylindrical coils in a Helmholtz configuration (curve 74). The vertical lines mark the region of the freely accessible air gap 76.

For the calculation it was assumed that an unobstructed distance of d=5 mm (FIG. 4) was available between the respective coil pair for the transport path of the banknote test specimens 10. Furthermore, it was assumed that each individual coil has ten windings and is realized with a conductor track having a width of 0.5 mm. The distance between successive turns is 0.25 mm in each case. For the inner radius $r_1$ of the planar coils a value of $r_1$=0.375 mm was assumed, and the effect of the respective coil carriers was neglected. These assumptions result in a length of 7.25 mm for the two cylindrical coils, and also an outer radius $r_2$ of 7.25 mm for the two planar coils.

The diagram 70 shows the field strength $B_{mod}$ calculated in the z-direction as a function of the axial location coordinate Z under these assumptions. The relevant part of the air gap between the lines 76 is also drawn at the values z=±2.5 mm corresponding to d=5 mm. As can be seen directly from the diagram, the planar coil pair according to the invention (curve 72) generates a modulation field $B_{mod}$ in the air gap with a significantly higher field strength than the conventional cylindrical coil pair (curve 74).

In addition to generating a higher modulation field, the planar coil pair according to the invention also requires significantly less installation space in the air gap than the corresponding cylindrical coil pair. Thus, the two planar coils combined have an axial extent in the z-direction of only 1 mm, while the two cylindrical coils combined have a z-extent of 14.5 mm. Taking into account the required unobstructed gap region of a height of d=5 mm for the banknote transport, the magnetic circuit must therefore have an air gap with a height of at least 19.5 mm if a pair of cylindrical coils is used. In contrast, if the planar coil pair according to the invention is used, an air gap with a height of only 6 mm is sufficient. A much stronger quasi-static polarization field $B_0$ is associated with this narrower air gap, which is another reason why a significantly higher signal strength can be achieved for the spin resonance measurement.

The diagram 80 of FIG. 6 shows experimental results of a comparison of planar coils according to the invention with conventional cylindrical coils that are wound around the magnetic core of a magnetic circuit outside the air gap. For the comparison measurement, a paper sample was loaded with a feature substance with a spin resonance signature and placed on a stripline resonator. The resonator was located within the air gap of a magnetic circuit made of soft iron. With this setup, two series of measurements were carried out.

In the first series of measurements, a spiral-shaped planar coil 30 of the type shown in FIG. 2 with a constant spacing of the conductor tracks was used as a modulation coil. The planar coil 30 is implemented on a circuit board and has a total of 25 turns with an inner radius $r_1=0.375$ mm and an outer radius $r_2=7.25$ mm. The total thickness of the printed circuit board manufactured in this way is 0.75 mm. The planar coil 30 was mounted directly in the air gap of the magnetic circuit and was a distance of 2.8 mm from the resonator along the z-axis.

In the second series of measurements, a conventional cylindrical coil was used as a modulation coil. The cylindrical coil was wound with 72 windings with a radius of 22.2 mm around the magnetic core of the magnetic circuit at the edge toward the air gap. The distance along the z-axis between the coil center and the stripline resonator was 7.1 mm.

Within each series of measurements, the spin resonance signature of the marker was recorded at different modulation frequencies $f_{mod}$ and the signal maximum of each measurement was extracted. For better comparability, the measured values obtained in this way were normalized to the overall maximum of both measurement series in order to obtain a normalized signal strength $S_n$. This normalized signal strength $S_n$ is plotted in diagram 80 as a function of the modulation frequency $f_{mod}$ and shows the frequency dependence of the signal strength when using a planar coil according to the invention (curve 82) or when using a conventional cylindrical coil (curve 84).

As shown in diagram 80, the signal strength of the spin resonance signal for both designs decreases with increasing modulation frequency $f_{mod}$. According to current understanding, this is primarily caused by eddy currents which are induced by the modulation field B mod in the soft iron of the magnetic circuit and weaken the generating modulation field according to Lenz's law. However, due to its size and position, the cylindrical coil induces eddy currents in the air gap to a much greater extent than the planar coil according to the invention. For this reason, the signal strength $S_n$ for the cylindrical coil (curve 84) drops significantly faster with increasing modulation frequency $f_{mod}$ than for the planar coil according to the invention (curve 82). A spin resonance sensor element for use in a high-speed banknote processing machine requires high modulation frequencies to reduce or avoid motion artifacts.

At such a high modulation frequency, the operation of a cylindrical coil wound around the magnetic core is inefficient due to the eddy currents and does not allow a sufficiently high signal strength of the spin resonance signal for reliable authenticity checking.

The invention claimed is:

1. A sensor element for checking a planar data carrier having a spin resonance feature, with
    a magnetic core having an air gap into which the planar data carrier can be inserted for authenticity checking and which defines an axial direction extending between the adjacent surfaces of the magnetic core,
    a polarization device for generating a static magnetic flux in the air gap,
    a modulation device for generating a time-varying magnetic modulation field in the air gap, and
    a resonator for exciting the spin resonance feature of the data carrier to be checked,
    wherein, the modulation device is formed by at least one planar coil arranged in the air gap, which has one or more turns about the axial direction of the air gap in one plane,
    wherein the at least one planar coil has a spiral-shaped conductor track layout with a minimum inner radius and a maximum outer radius.

2. The sensor element according to claim 1, wherein an outer contour of the conductor track layout of the at least one planar coil is circular, elliptical, rectangular or polygonal.

3. The sensor element according to claim 1, wherein a conductor track spacing (A) of successive turns is constant.

4. The sensor element according to claim 1, wherein the number of turns of the at least one planar coil is between 2 and 100 (inclusive in each case).

5. The sensor element according to claim 1, wherein the modulation device contains two planar coils axially spaced apart on the upper side and underside of the air gap.

6. The sensor element according to claim 5, wherein the two aforementioned planar coils are arranged and matched to each other in such a way that they generate a homogeneous field pattern of the modulation field between each other, such that the two aforementioned planar coils are each formed with a conductor track layout having the same minimum inner radius and the same maximum outer radius and are a distance apart in the axial direction which essentially corresponds to double the inner radius.

7. The sensor element according to claim 1, wherein the at least one planar coil is formed on a coil carrier, a printed circuit board, or on a ferromagnetic carrier.

8. The sensor element according to claim 1, wherein the at least one planar coil together with a capacitance forms a resonant oscillator circuit.

9. The sensor element according to claim 1, wherein the modulation device comprises at least one double planar coil, in which the coils of a planar coil are arranged coaxially on the upper side and underside of a coil carrier.

10. The sensor element according to claim 1, wherein the resonator is formed on a printed circuit board in the form of a planar surface resonator, a stripline resonator, and together with the at least one planar coil is arranged on different printed circuit board layers of the same component.

11. A checking device for checking planar data carriers, having a sensor element according to claim 1 and having a transport device which inserts the planar data carriers to be checked into the air gap of the magnetic core along a transport path or guides them through the air gap of the magnetic core.

12. A method for checking a planar data carrier having a spin resonance feature, by means of a sensor element according to claim 1, wherein in the method:

a planar data carrier to be checked is inserted into the air gap of the magnetic core of the aforementioned sensor element, the polarization device is used to generate a static magnetic flux in the air gap, the modulation device is used to generate a time-varying magnetic modulation field in the air gap, wherein a device is provided as the modulation device, which is formed by at least one planar coil arranged in the air gap, which planar coil has one or more turns about the axial direction of the air gap in one plane, and the resonator is used to excite the spin resonance feature of the data carrier to be checked.

13. The method according to claim 12, wherein the resonator is also used to record a response signal of the spin resonance feature generated by the excitation and output said signal to a detector.

14. The method according to claim 12, wherein the excitation of the spin resonance feature and/or the recording of the response signal of the spin resonance feature is/are carried out in a continuous wave method, in a pulsed method, or in a rapid scan method.

* * * * *